United States Patent [19]

Shekar et al.

[11] Patent Number: 5,291,128
[45] Date of Patent: Mar. 1, 1994

[54] MOTOR TESTING APPARATUS UTILIZING INERTIAL LOADING

[75] Inventors: Manoj M. Shekar, Rochester; Charles R. Eimers, Holley; Daniel P. Welker, Rochester, all of N.Y.

[73] Assignee: General Motors Corporation, Detroit, Mich.

[21] Appl. No.: 885,936

[22] Filed: May 19, 1992

[51] Int. Cl.$^5$ .......................................... G01R 33/00
[52] U.S. Cl. ............................ 324/158 MG; 318/490
[58] Field of Search .......... 324/158 MG, 158 R, 547; 340/648; 318/490; 322/99

[56] References Cited

U.S. PATENT DOCUMENTS

| | | | |
|---|---|---|---|
| 4,156,188 | 5/1979 | Kreissl | 324/158 MG |
| 4,577,151 | 3/1986 | Tanisaka et al. | 324/158 MG |
| 4,658,213 | 4/1987 | Finley | 324/158 MG |
| 4,741,023 | 4/1988 | Lawson | 379/106 |
| 4,851,766 | 7/1989 | Shiobara et al. | 324/158 MG |
| 4,965,513 | 10/1990 | Haynes et al. | 324/158 MG |
| 4,978,909 | 12/1990 | Hendrix et al. | 324/77 B |
| 5,049,815 | 9/1991 | Kliman | 324/158 MG |

*Primary Examiner*—Vinh Nguyen
*Attorney, Agent, or Firm*—Mark A. Navarre; Anthony Luke Simon

[57] ABSTRACT

An improved testing apparatus for an electric motor in which the motor windings are energized in a manner to produce low frequency oscillatory rotation of the motor armature. Under such conditions, motor loading is provided by the rotary inertia of the armature itself, eliminating the need for a separate loading device such as a dynamometer. As with conventional testing practice, the test controller records motor current, voltage and phase shift information to evaluate the electrical characteristics of the motor under test. The test apparatus is readily adapted to test different sizes and types of motors.

2 Claims, 4 Drawing Sheets

MOTOR TESTING APPARATUS UTILIZING INERTIAL LOADING

This invention relates to dynamic testing of electric motors, and more particularly, to test apparatus which utilizes the motor inertia for loading purposes.

BACKGROUND OF THE INVENTION

It is common practice in the manufacture of electric motors to individually test newly manufactured motors under load to verify proper motor performance and to identify any of a number of potential defects which may have occurred in the manufacturing process. In conventional practice, the armature of a motor under test is connected to a dynamometer, and the motor windings are energized at a typical operating point. The motor voltage, current, power factor, and the like are typically measured and compared to limit values to generate a pass/fail indication for the motor.

With the above-described test procedure, the dynamometers must be carefully calibrated and aligned in order to prevent unwarranted motor fail indications. This, of course, can be very costly and time consuming.

SUMMARY OF THE PRESENT INVENTION

The present invention is directed to an improved testing apparatus for an electric motor in which the motor windings are energized in a manner to produce low frequency oscillatory forward and reverse dispercement of the motor armature. Under such conditions, motor loading is provided by the characteristic rotary inertia of the armature itself, eliminating the need for a separate loading device such as a dynamometer. As with conventional testing practice, the test controller records motor current, voltage and phase shift information to evaluate the electrical characteristics of the motor under test.

In the preferred embodiment, the testing apparatus of this invention is applied to a 150-watt direct current (DC) motor having a permanent magnet field. A microprocessor-based test controller operates in conjunction with a power amplifier to energize the armature winding of the motor with a sinusoidal test voltage having a frequency of approximately 2–3 Hz. The motor current, voltage and phase angle are monitored to determine if the current amplitude, dissipated power and phase-shift compensated current fall within prescribed limits.

The down time traditionally allocated to perform dynamometer calibration and maintenance is virtually eliminated and the test apparatus is readily adapted to test different sizes and types of motors.

DETAILED DESCRIPTION OF THE INVENTION

Figure 1:
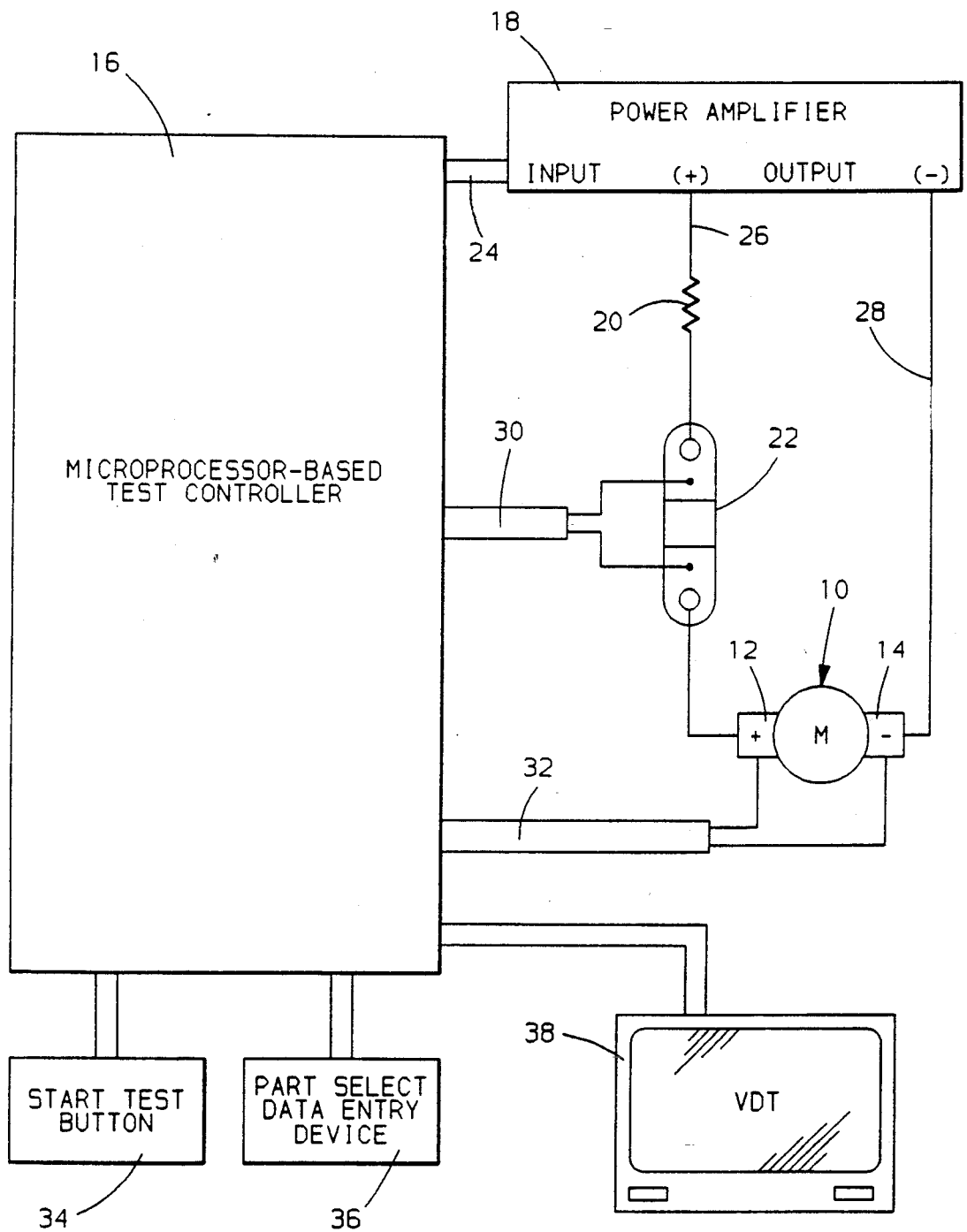
FIG. 1 is a schematic diagram of a motor and test apparatus according to this invention, including a microprocessor-based test controller.

Referring to FIG. 1, the reference numeral 10 generally designates a permanent magnet field DC motor having positive and negative brushes 12 and 14 connected to the motor armature windings via a conventional commutator assembly (not shown). The test apparatus includes a microprocessor-based test controller 16, a power amplifier 18, a current limit power resistor 20 and a current shunt resistor 22. The test controller may be an off-the-shelf microprocessor system such as the Macintosh IIfx, manufactured by Apple Computer, Inc., including suitable A/D, D/A and I/O devices. The power amplifier may be an off-the-shelf audio amplifier such as the FET-2000C, manufactured by Ashly Corporation.

The test controller 16 supplies a low level sinusoidal test voltage to power amplifier 18 via cable 24, and power amplifier 18 develops an amplified test voltage across positive and negative output lines 26 and 28. Current limit resistor 20, shunt resistor 22 and the armature windings of motor 10 are connected in series across the amplifier output lines 26, 28, as shown.

Feedback test signals are provided as inputs to the test controller 16 via wire pairs 30 and 32. The wire pair 30 is connected across shunt resistor 22, to provide a motor current feedback signal, and the wire pair 32 is connected across brushes 12, 14 to provide a motor voltage signal. Other inputs to test controller 16 include an operator actuated START TEST button 34, and a PART SELECT data entry device 36. The device 36 identifies the motor under test to the test controller 16 to permit the testing of motors having diverse operating characteristics.

Figure 3:
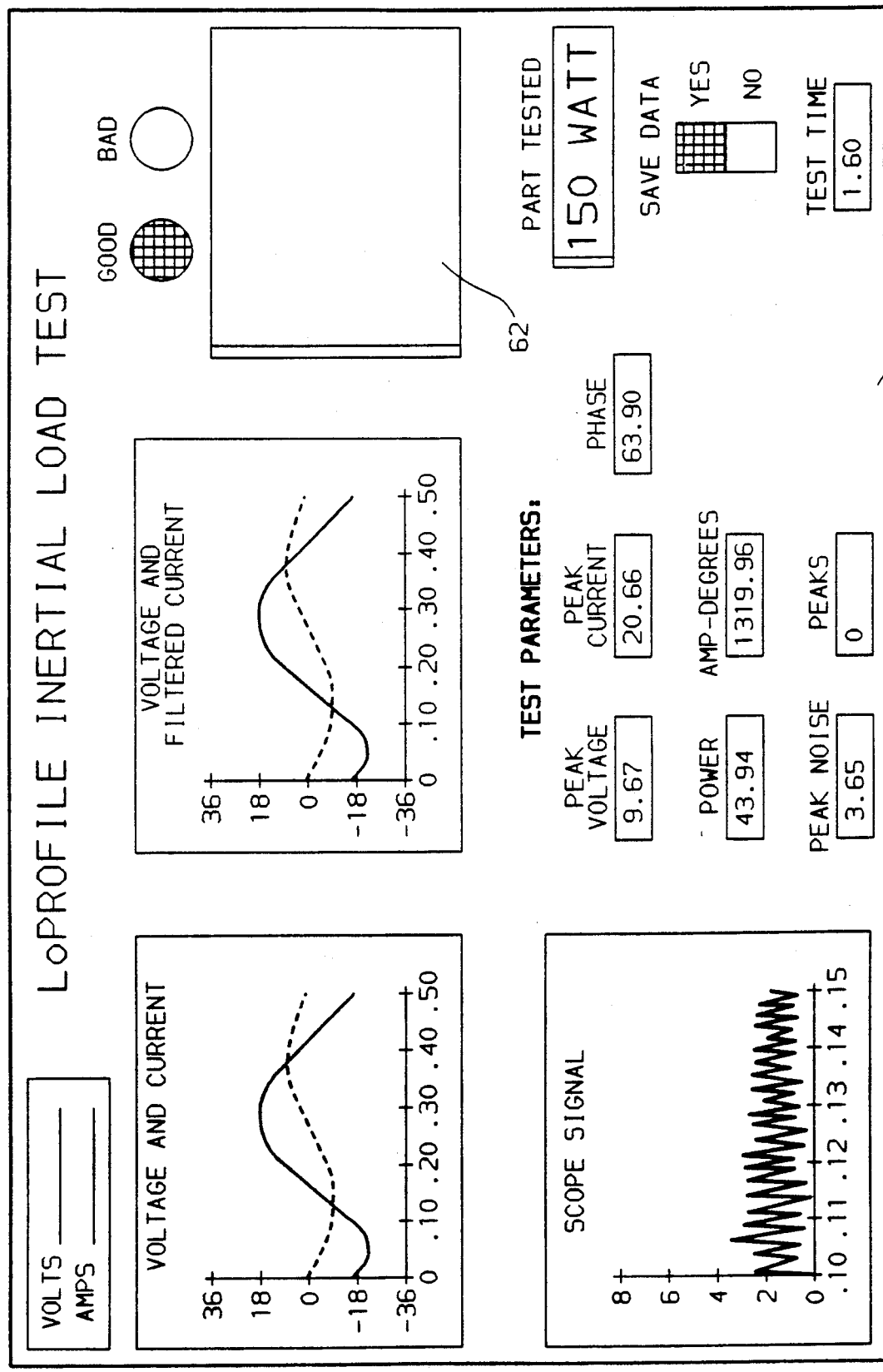
FIG. 3 depicts a display developed by the test controller of FIG. 1.

Data determined in the course of motor testing is displayed on a conventional oscilloscope (not shown) or a video display terminal (VDT) 38. Representative display graphics for VDT 38 are depicted in FIG. 3.

In the illustrated embodiment, the test controller 16 utilizes readily available data acquisition and analysis software, such as that marketed by National Instruments, Inc. under the tradename LabVIEW. This software is used to generate the 2–3 Hz sinusoid test voltage provided on output line 24, and to sample the motor current and motor voltage signals provided on wire pairs 30 and 32. The test controller 16 divides motor current signal into a low frequency sinusoidal component (LF CURRENT), and a high frequency component (HF CURRENT) containing the commutation and brush noise.

The LF CURRENT, in conjunction with the motor voltage signal, yields information regarding the motor impedance and the phase difference between the motor current and voltage. This, in turn, enables computation of the motor power consumption (P) and the phase-shift compensated motor current in ampere-degrees. Empirically determined limits are placed on the current amplitude, the phase shift (THETA), the power consumption and the computed ampere-degrees, and the motor under test is rejected if its measured characteristics fall outside the prescribed limits.

A portion of the HF CURRENT signal is also analyzed to determine the number of times the signal crosses a threshold current for a given period of time. This test is designed to identify motors having poor armature welds and commutator bar shorting.

Figure 2A:
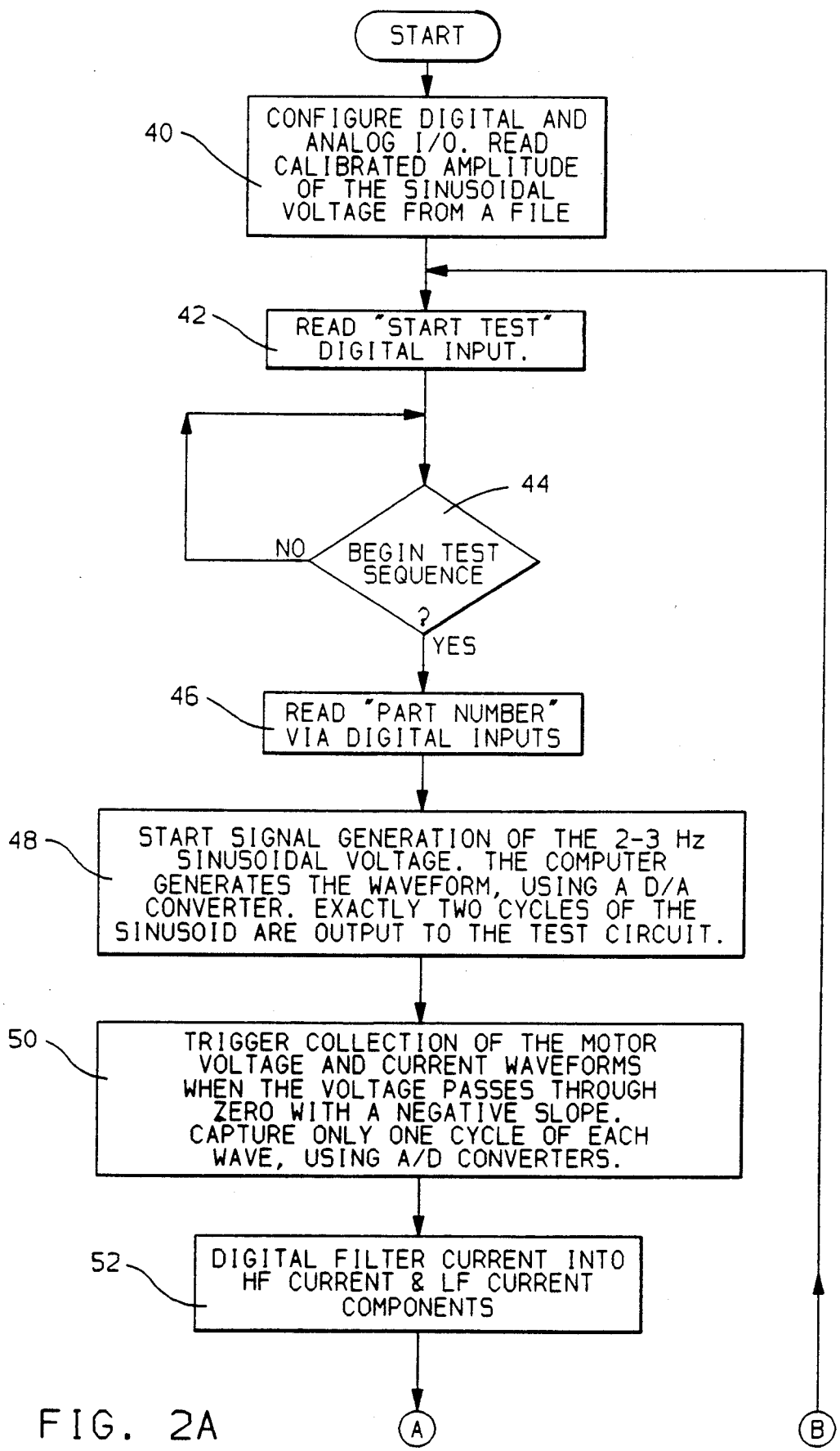
FIGS. 2a–2b depict flow diagrams representative of computer program instructions executed by the test controller of FIG. 1 in carrying out a motor test according to this invention.
Figure 2B:
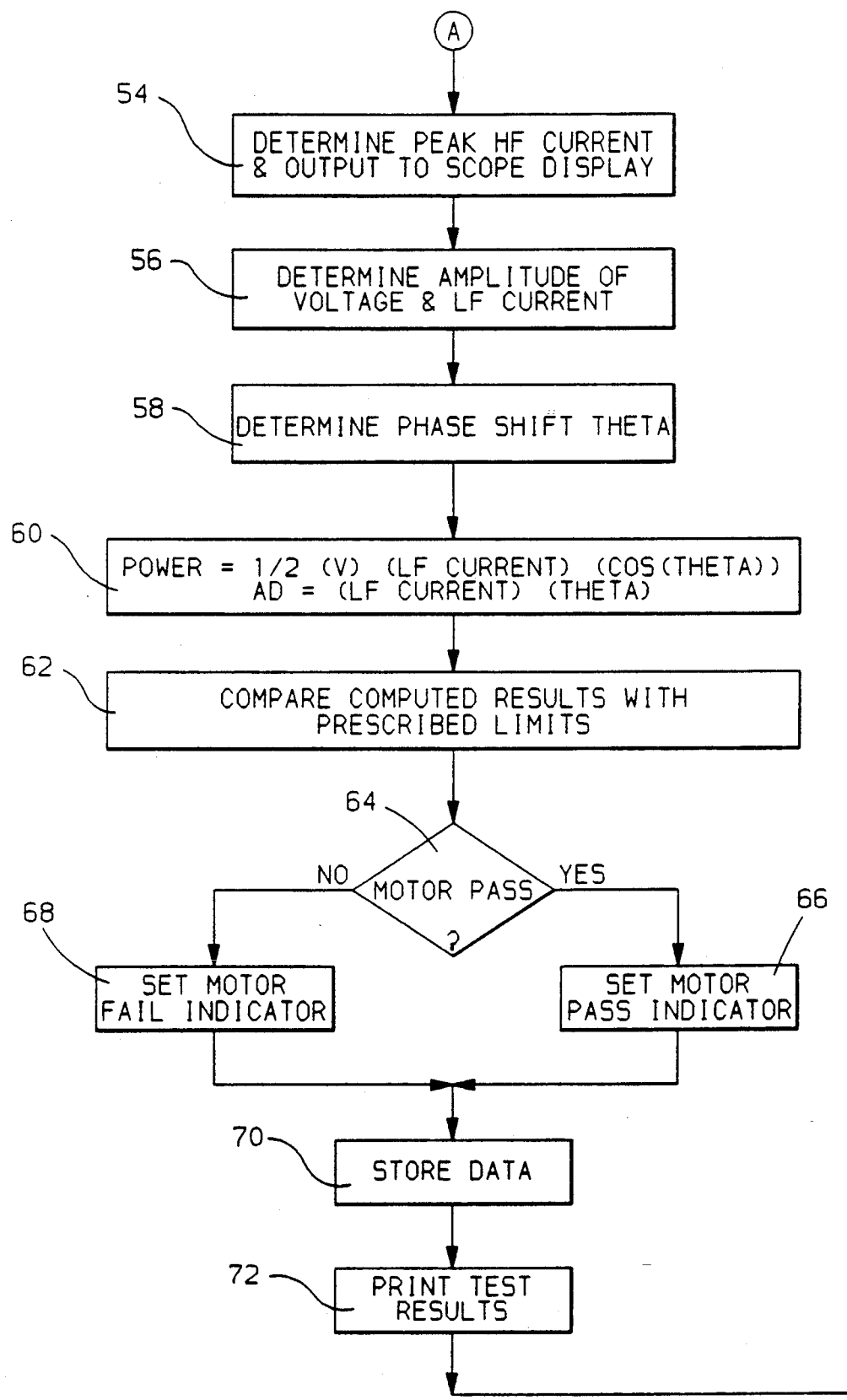

The flow diagram of FIGS. 2a–2b represents the program instructions carried out by test controller 16 according to this invention. The block 40 designates a series of initialization instructions executed at the initiation of system operation for configuring the input/output protocol and fetching a calibrated sinusoid voltage amplitude from a nonvolatile data file. Once the START TEST button 34 has been depressed, as determined by the blocks 42-44, the test controller 16 reads the PART NUMBER entered into PART SELECT date entry device 36, as indicated at block 46. The blocks 48 and 50 are then executed to generate and output two cycles of a sinusoidal test voltage on line 24, and to capture one full cycle of the motor voltage and current waveforms. In the illustrated embodiment, the voltage and current data collection is initiated when the motor voltage crosses zero with a negative slope.

Once the motor voltage and current waveforms have been captured, the block 52 is executed to filter the current into the LF CURRENT and HF CURRENT components, using a 6th order polynomial fit of the original sinusoidal waveform. The block 54 determines the peak value of the HF CURRENT component and outputs the same to an oscilloscope for visual inspection by the operator. The blocks 56-60 are then executed to determine the amplitudes of the motor voltage (V) and the LF CURRENT component, to determine the phase shift (THETA), and to compute the POWER and ampere-degrees (AD). As indicated, the POWER term is computed according to the expression:

$$POWER = (\tfrac{1}{2})\,(V)\,(LF\ CURRENT)\,(COS(THETA))$$

The computed results are then compared with empirically derived limit values, as indicated at block 62. If the computed results are within the limits, as determined at block 64, the block 66 is executed to set a MOTOR PASS flag. Otherwise, the block 68 is executed to set a MOTOR FAIL flag. In any event, the blocks 70-72 are then executed to store the captured data and to print the test results to the VDT 38. Thereafter, the test is terminated, and test controller 16 waits for the next depression of START TEST button 34, as indicated by the circled letter B.

FIG. 3 depicts a representative test information display from VDT 38 for a good 150-Watt motor. Test parameters, such as the peak voltage and current, the phase-angle, the power consumption, the ampere-degrees, the peak HF CURRENT amplitude and the number of HF CURRENT peaks in excess of a threshold are digitally displayed in a region of the display designated by the reference numeral 60. The measured voltage waveform and the current components LF CURRENT and HF CURRENT are displayed in graphical format, as shown.

A good/bad indicator is lit in accordance with the comparison of the measured parameters with predefined limit thresholds, and the nature of the detected fault in the case of a bad motor is indicated in the region of the display designated by the reference numeral 62. In addition, the display indicates the PART SELECT data (150 WATT), the time of the test, and includes an operator actuated switch for electing whether to save the generated data.

While this invention has been described in reference to the illustrated embodiment, it is expected that various modifications will occur to those skilled in the art. In this regard, it should be understood that test apparatus incorporating such modifications may fall within the scope of this invention, which is defined by the appended claims.

The embodiments of the invention in which an exclusive property or privilege is claimed are defined as follows:

1. Apparatus for dynamically testing a motor under load, including a power supply connected to apply a test voltage to the motor, means for measuring specified motor operating parameters during the course of testing to detect a motor defect, and means for indicating a detected defect, the improvement comprising:

means for controlling the power supply so that the applied test voltage has an amplitude which sinusoidally oscillates at a frequency which produces oscillatory forward and reverse displacement of an armature of said motor, thereby loading the motor with a characteristic inertia of said armature, and eliminating the need for a separate armature loading device.

2. Apparatus for dynamically testing a motor under load, comprising excitation means including a power supply for applying a test voltage to the motor, the test voltage having an amplitude which sinusoidally oscillates at a frequency which produces oscillatory forward and reverse displacement of an armature of said motor;

sensor means for measuring specified motor operating parameters during the application of said test voltage to said motor;

analyzing means for comparing said measured operating parameters with predetermined limit values to detect a defect in said motor; and output means for indicating a rejection of said motor in response to the detection of a defect by said analyzing means.

* * * * *